(12) United States Patent
Cho et al.

(10) Patent No.: US 7,887,905 B2
(45) Date of Patent: *Feb. 15, 2011

(54) CONSTRAINING GREEN SHEET AND MANUFACTURING METHOD OF MULTI-LAYER CERAMIC SUBSTRATE USING THE SAME

(75) Inventors: Beom Joon Cho, Gyunggi-do (KR); Jong Myeon Lee, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/324,006

(22) Filed: Nov. 26, 2008

(65) Prior Publication Data

US 2009/0142582 A1 Jun. 4, 2009

(30) Foreign Application Priority Data

Nov. 29, 2007 (KR) ...................... 10-2007-0123036

(51) Int. Cl.
*B32B 9/00* (2006.01)

(52) U.S. Cl. .................... 428/210; 428/325; 156/89.13; 501/32; 361/319

(58) Field of Classification Search ................. 428/210, 428/325; 361/321.1, 319; 156/89.13; 501/32
See application file for complete search history.

(56) References Cited

U.S. PATENT DOCUMENTS

| | | | | |
|---|---|---|---|---|
| 4,900,698 | A | * | 2/1990 | Lundsager .................... 501/80 |
| 5,008,151 | A | * | 4/1991 | Tominaga et al. ............ 428/343 |
| 5,474,741 | A | * | 12/1995 | Mikeska et al. ........... 427/376.7 |
| 6,139,666 | A | * | 10/2000 | Fasano et al. .................. 156/85 |
| 6,245,171 | B1 | * | 6/2001 | Natarajan et al. ......... 156/89.11 |
| 6,776,862 | B2 | * | 8/2004 | Sakamoto ................. 156/89.12 |
| 7,396,785 | B2 | * | 7/2008 | Takada et al. .................. 501/10 |
| 7,547,369 | B2 | * | 6/2009 | Khadilkar et al. ......... 156/89.11 |

FOREIGN PATENT DOCUMENTS

| | | |
|---|---|---|
| JP | 05-102666 * | 4/1993 |
| JP | 07-030253 | 1/1995 |
| JP | 2004-288938 | 10/2004 |
| JP | 2005-264246 | 9/2005 |
| JP | 2006-100448 | 4/2006 |
| JP | 2006-173456 | 6/2006 |
| JP | 2007-152178 | 6/2007 |
| KR | 10-2002-0090296 | 12/2002 |

OTHER PUBLICATIONS

Korean Office Action issued in Korean Patent Application No. 10-2007-0123036, dated Jun. 23, 2009.
Japanese Office Action, with English Translation, issued in Japanese Patent Application No. 2008-304440, dated Dec. 21, 2010.

* cited by examiner

*Primary Examiner*—Cathy Lam
(74) *Attorney, Agent, or Firm*—McDermott Will & Emery LLP (57) ABSTRACT

There is provided a constraining green including a first constraining layer having a surface disposed on the one of the top and bottom surfaces of the ceramic laminated body, the first constraining layer containing a first inorganic powder; and a second constraining layer disposed on a top of the first constraining layer and containing a second inorganic powder and a fly ash. The constraining green sheet serves to ensure less shrinkage of the ceramic laminated body and improve debinding characteristics.

4 Claims, 5 Drawing Sheets

CONSTRAINING GREEN SHEET AND MANUFACTURING METHOD OF MULTI-LAYER CERAMIC SUBSTRATE USING THE SAME

CROSS-REFERENCE TO RELATED APPLICATIONS

This application claims the priority of Korean Patent Application No. 2007-123036 filed on Nov. 29, 2007, in the Korean Intellectual Property Office, the disclosure of which is incorporated herein by reference.

BACKGROUND OF THE INVENTION

1. Field of the Invention

The present invention relates to a constraining green sheet and a method of manufacturing a multilayer ceramic substrate, and more particularly, to a hard-to-sinter constraining green sheet utilized for manufacturing a low-temperature co-fired substrate by constrained sintering, and a multilayer ceramic substrate using the same.

2. Description of the Related Art

In general, a multilayer ceramic substrate using glass-ceramics ensures implementation of a three-dimensional inter-layer circuit and formation of a cavity. This allows devices with various functions to be embedded in the multi-layer ceramic substrate, with high flexibility in design.

Accordingly, in the market of smaller and higher-performing high-frequency parts, the multilayer ceramic substrate is increasingly utilized. A multi-layer ceramic substrate in an incipient stage has been manufactured by forming a circuit pattern and a via on a ceramic green sheet as a conductive electrode, arranging and laminating the plurality of green sheets to a desired thickness according to design. In this process, the ceramic substrate shrinks in volume by about 35 to 50%. Particularly, the ceramic substrate shrinks about 12 to 17% in horizontal and vertical lengths, respectively in a transverse direction. This transverse shrinkage can be hardly controlled uniformly. The transverse shrinkage involves an error of 0.5% in respective manufacturing stages and an identical manufacturing stage as well.

With the multilayer ceramic substrate more complicated and precise, inner patterns and via structures have less margin in design and thus constrained sintering is required to suppress transverse shrinkage of the multilayer ceramic substrate.

To this end, a hard-to-sinter flexible green sheet which is not sintered at a sintering temperature of the ceramic substrate material, is bonded to at least one of two surfaces of the multilayer ceramic substrate in order to suppress shrinkage of the multilayer ceramic substrate in a plane direction. Notably, a load is applied onto the multilayer ceramic substrate to prevent the substrate from being warped during sintering. Here, the multilayer ceramic substrate may experience lack of passages for de-binding in the process of sintering, thereby degrading sintering characteristics. Moreover, a sintered ceramic laminated body may have great residual carbon content, which can undermine the reliability of the ceramic substrate.

Japanese Patent Laid-open Publication No. hei 7-30253 discloses a conventional technology for de-binding. Under this technology, even when a constraining green sheet is employed, de-binding is relatively easily assured. Specifically, a hole is perforated in the constraining green sheet to ensure sufficient de-binding of an inner ceramic substrate and a resin which is more easily thermally decomposable than an organic binder included in a non-sintered ceramic laminated body is filled in the hole. However, this technology entails an additional burdensome process of perforating the hole in the constraining layer and deformability of a sintered body due to the hole.

Moreover, Korean Patent Publication No. 2002-0090296 discloses a technology in which an organic binder having an initial thermal decomposition temperature lower than an organic binder of a green sheet for a sintered body is employed in a constraining green sheet to remove the binder of the constraining green sheet and then the binder of the green layer of the sintered body is released easily through a passage generated thereby.

However, to maximize a constraining force of the constraining green sheet, a powder of the constraining layer should be pulverized and added in a higher amount to maximally increase a contact point between the constraining layer and the ceramic laminated body. This however may not ensure pores to be sufficiently formed inside the constraining green sheet. Unless pores are formed sufficiently, the binder decomposed or burned from the ceramic laminated body can hardly be released outward from hundreds of microns of the green sheet through pores inside the constraining green sheet, even though an organic material of the constraining green sheets is decomposed first. This does not yield sufficient de-binding effect.

Figure 1:
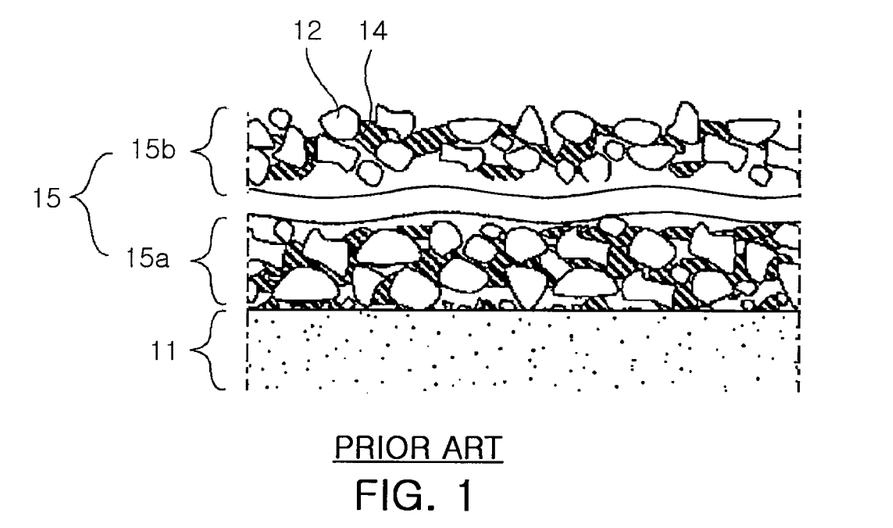
FIG. 1 is a vertical cross-sectional view illustrating a conventional hard-to-sinter constraining green sheet.

Furthermore, an alternative technology is disclosed in Japanese Laid-open Publication No. 2006-173456. Under the technology, as shown in FIG. 1, a volume content of an organic binder 14 and an inorganic powder particle 12 of a constraining green sheet 15 is greater on an area around a free surface 15b than on an area around a contact surface 15a with a multilayer ceramic substrate 11. That is, the organic material contents differ between the contact surface and the free surface to enhance a bonding force between a ceramic substrate and a constraining layer and also to facilitate de-binding toward the free surface of the constraining layer with a greater number of pores.

However, since density gradients of components are formed through precipitation inside the constraining green sheet 15 using doctor blading, it is very hard to attain reproducibility of appropriate thickness and volume contents for respective areas. Moreover, under this technology, powder particles are easily precipitated onto the bottom when the constraining green sheet is formed, thereby requiring an inorganic powder with greater particle size, for example, twice greater than particles of the ceramic substrate to reduce an organic binder amount on the bottom. This renders it hard to obtain a sufficient contact point between the green sheet and the ceramic substrate. Furthermore, this hardly increases a capillary force for moving the organic binder from the ceramic substrate to the constraining green sheet.

SUMMARY OF THE INVENTION

An aspect of the present invention provides a constraining green sheet which contains a fly ash at a temperature lower than a sintering temperature of a ceramic laminated body and ensures a passage for debinding through burning of the fly ash when the ceramic laminated body is sintered, and a manufacturing method of the multilayer ceramic substrate.

According to an aspect of the present invention, there is provided a constraining green sheet including: a first constraining layer having a surface disposed on one of top and bottom surfaces of a ceramic laminated body, the first constraining layer containing a first inorganic powder; and a second constraining layer disposed on a top of the first constraining layer and containing a second inorganic powder and a fly ash.

The first inorganic powder may have a particle size of 1.0 to 2.5 µm.

The fly ash may be burned at a temperature lower than a sintering temperature of the ceramic laminated body.

The fly ash may include at least one material selected from a group consisting of carbon, black lead, activated carbon, wood powder, sawdust, and talc.

A method of manufacturing a multilayer ceramic substrate, the method including: providing a non-sintered ceramic laminated body including a plurality of ceramic green sheets; providing at least one constraining green sheet including a first constraining layer containing a first inorganic powder and a second constraining layer containing a second inorganic powder and a fly ash; disposing the constraining green sheet such that a surface of the first constraining layer is bonded to one of top and bottom surfaces of the ceramic laminated body; and sintering the ceramic laminated body at a predetermined sintering temperature.

The providing at least one constraining green sheet may include: applying a first slurry including the first inorganic powder by doctor blading; applying a second slurry including the second inorganic powder and the fly ash on the first slurry by doctor blading; and drying the first and second slurries.

The fly ash(pore-forming material) is burned at a temperature lower than the sintering temperature of the ceramic laminated body.

The sintering the ceramic laminated body may include burning the fly ash included in the second constraining layer to form a void.

The first inorganic powder may have a particle size of 1.0 to 2.5 µm.

The fly ash(pore-forming material) may include at least one material selected from a group consisting of carbon, black lead, activated carbon, wood powder, sawdust, and talc.

The method may further include: removing the constraining green sheet laminated on the one of the top and bottom surfaces of the ceramic laminated body when the ceramic laminated body is sintered; and forming an external electrode on the ceramic laminated body.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 2:
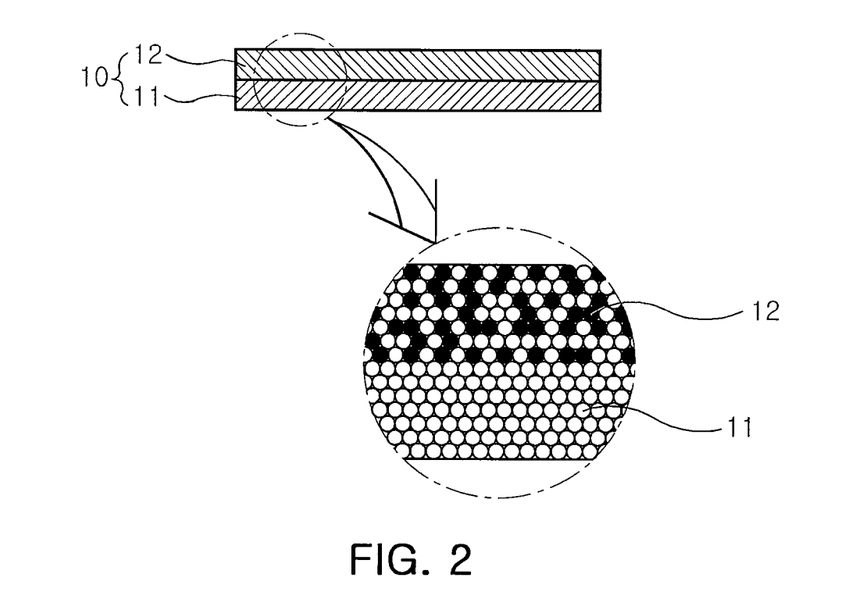
FIG. 2 is a cross-sectional view illustrating a constraining green sheet according to an exemplary embodiment of the invention.

FIG. 2 is a vertical cross-sectional view illustrating a constraining green sheet according to an exemplary embodiment of the invention. Referring to FIG. 2, the constraining green sheet 10 includes a first constraining layer 11 and a second constraining layer 12. Here, the first constraining layer 11 contains a first inorganic powder and the second constraining layer 12 contains a second inorganic powder and a fly ash.

Referring to the partial magnified view of the constraining green sheet 10, the first constraining layer 11 includes the first inorganic powder and the second constraining layer 12 includes the second inorganic powder and the fly ash. Here, the fly ash of the second constraining layer 12 is burned at a temperature lower than a sintering temperature of the ceramic laminated body. The fly ash(pore-forming material) can be removed through burning in the sintering process. Accordingly, voids created by removal of the fly ash(pore-forming material) during the sintering can serve as a passage for debinding.

That is, the first inorganic powder of the first constraining layer 11 of the constraining green sheet 10 is bonded to the ceramic laminated body to suppress shrinkage of the ceramic laminated body. Also, the second constraining layer 12 secures a passage for debinding through burning of the fly ash to enhance debinding characteristics during sintering. Here, the first inorganic powder and the second inorganic powder may employ an identical inorganic powder or different inorganic powders. At this time, the first inorganic powder may have an average particle size of about 1.0 to 2.5 µm.

Figure 3A:
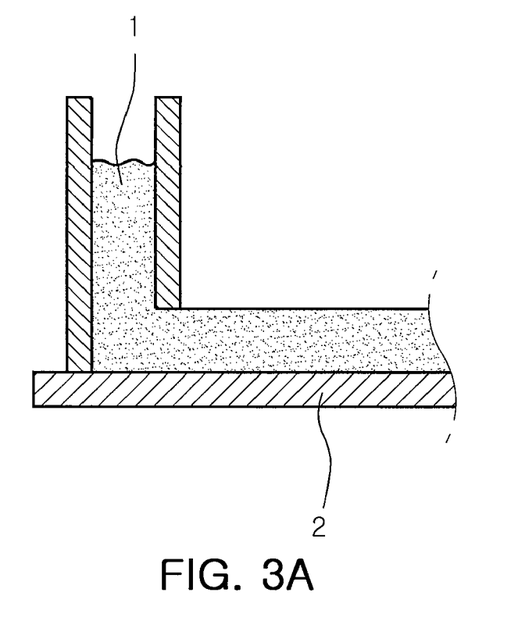
FIGS. 3A and 3B illustrate a constraining green sheet according to an exemplary embodiment of the invention, respectively.

FIGS. 3A to 3B are schematic views illustrating a method of manufacturing the constraining shown in FIG. 2. Referring to FIG. 3A, first, an organic binder, a dispersant and a mixed solvent are added to a first inorganic powder to produce a first slurry 1. Then, the first slurry 1 is applied on a polyethylene terephthalate (PET) film 2 using doctor blading. Here, the first inorganic powder may have an average particle size of 1.0 to 2.5 µm.

Figure 3B:
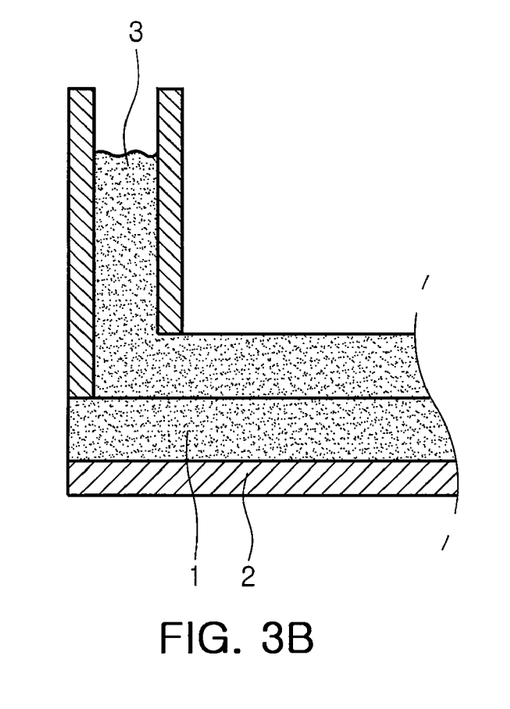

Meanwhile, a fly ash, an organic binder, a dispersant and a mixed solvent are added to the second inorganic powder to prepare a second slurry 3. Then, before the first slurry 1 is dried, the second slurry 3 is applied and dried on the first slurry 1. The fly ash is a material burned at a temperature lower than a sintering temperature of the ceramic laminated body. The fly ash may employ a material selected from one of carbon, black lead, activated carbon, wood powder, sawdust and talc.

Moreover, the second inorganic powder may adopt a material having density lower than the first inorganic powder to be prevented from moving to a lower layer where the first slurry 1 is located, in the process of drying the first and second slurries 1 and 3. These processes produce the constraining green sheet 10 shown in FIG. 2. Here, the constraining green sheet 10 may be formed in pluralities to be bonded to top and bottom surfaces of the ceramic laminated body.

FIGS. 4A to 4D are vertical cross-sectional views illustrating a method of manufacturing a multilayer ceramic substrate according to an exemplary embodiment of the invention.

Figure 4A:
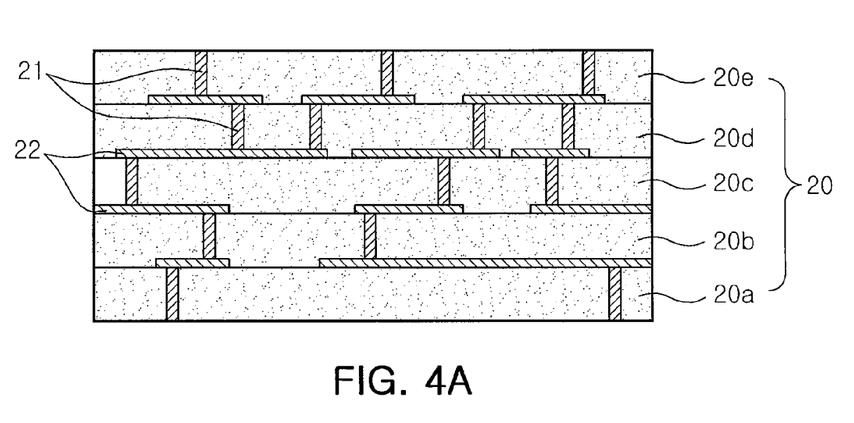
FIGS. 4A to 4D are cross-sectional views illustrating a method of manufacturing a multilayer ceramic substrate according to an exemplary embodiment of the invention.
Figure 4B:
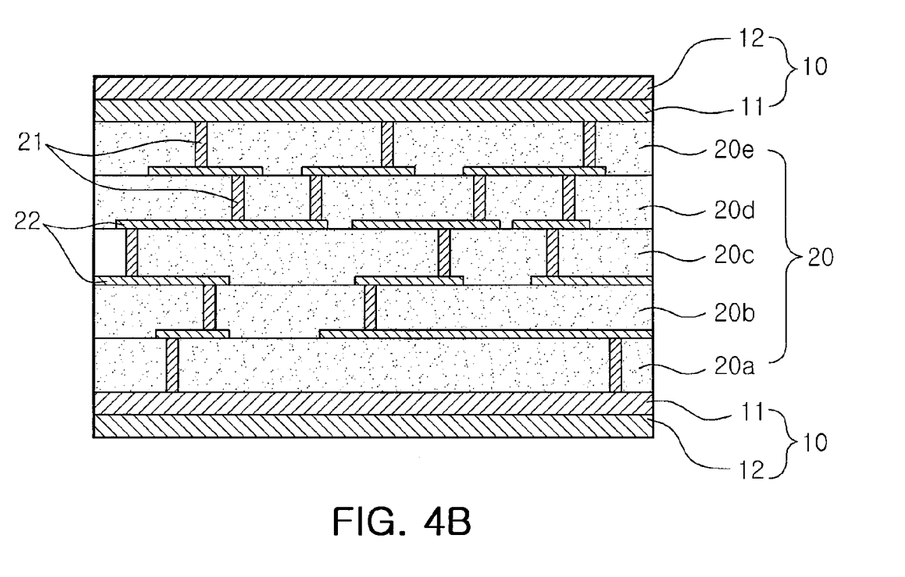
Figure 4C:
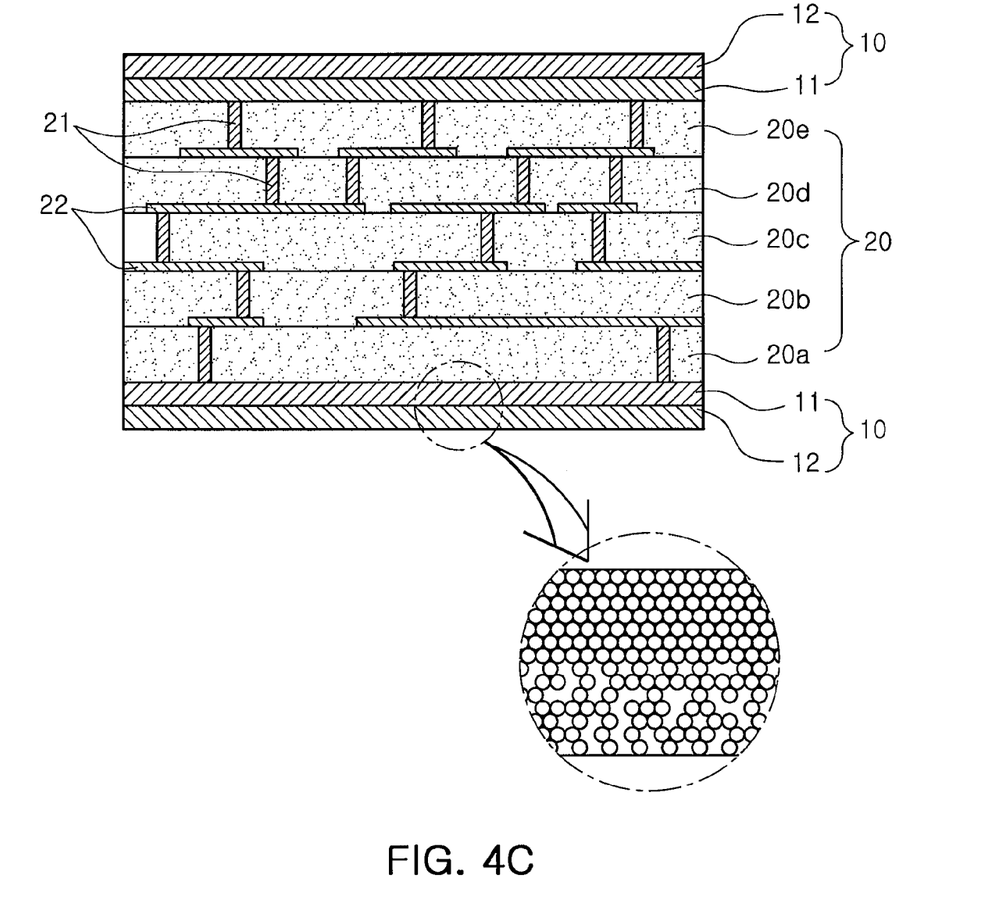

FIGS. 4A to 4C are vertical cross-sectional views illustrating a method of manufacturing a multilayer ceramic substrate according to an exemplary embodiment of the invention. As shown in FIG. 4A, a plurality of ceramic green sheets 20a, 20b, 20c, 20d, and 20e are laminated to form a ceramic laminated body 20. The ceramic green sheets 20a, 20b, 20c, 20d, and 20e each may be obtained by an adequate known art by adding an organic material such as an organic binder to a low-temperature sinterable glass-ceramic powder. Here, each of the ceramic green sheets 20a, 20b, 20c, 20d, and 20e may include an internal circuit pattern by forming an internal electrode 22 thereon. In order to form the internal electrode 22, a via hole 21 may be formed in the each of the green sheets 20a, 20b, 20c, 20d, and 20e to fill a conductor paste therein or the conductor paste may be screen printed on the each of the green sheet. The plurality of ceramic green sheets 20a, 20b, 20c, 20d, and 20e fabricated as described above are laminated atop one another to provide the ceramic laminated body 20 shown in FIG. 4A. Referring to FIG. 4A, four ceramic green sheets were laminated for convenience of description to manufacture the ceramic laminated body 20 but the number of the ceramic green sheets can be easily varied.

Afterwards, referring to FIG. 4B, constraining green sheets 10 each including first and second constraining layers 11 and 12 are laminated on top and bottom surfaces of the ceramic laminated body 20, respectively and the ceramic laminated body 20 is sintered. Specifically, first constraining layers 11 may have one surfaces bonded to the top and bottom surfaces of the ceramic laminated body 20, respectively.

The constraining green sheets 10 may employ the constraining green sheets 10 shown in FIG. 2. That is, each of the constraining green sheets 10 may include the first constraining layer 11 containing a first inorganic powder and the second constraining layer 12 containing a second inorganic powder and a fly ash. Here, the first and second inorganic powders contained in the first and second constraining layers 11 and 12, respectively are formed of a hard-to-sinter powder which is not sintered at a sintering temperature of the ceramic laminated body 20. The hard-to-sinter powder for the first and second inorganic powders may employ at least one material selected from alumina ($Al_2O_3$) powder, magnesia (MgO) powder, cerium dioxide ($CeO_2$), zinc oxide ($ZnO_2$), zirconia ($ZrO_2$) and boron nitride (BN). Here, the hard-to-sinter powder used as the first inorganic powder may have a small average particle size to increase a contact point with the ceramic laminated body 20. Specifically, the first inorganic powder may have an average particle size of about 1.0 to 2.5 μm.

Also, the fly ash contained in the second constraining layer 12 is burned at a temperature lower than a sintering temperature of the ceramic laminated body 20. The fly ash is formed of at least a material selected from a group consisting of carbon, black lead, activated carbon, wood powder, sawdust and talc.

As shown in FIG. 4C, when sintering is completed, the ceramic laminated body 20 is sintered and shrinks in a z direction. Moreover, the fly ash of the second constraining layer 12 of the constraining green sheets 10 is burned and removed during sintering. Partial magnification of the constraining green sheets 10 shows that the fly ash of each of the second constraining layers 12 has been removed to form voids. That is, as the fly ash is burned during the sintering, the voids are formed to serve as a passage for debinding.

As described above, the first constraining layers 11 each containing the first inorganic powder increase a contact point with the ceramic laminated body 20 and ensure less shrinkage. The second constraining layers 12 each containing the second inorganic powder and fly ash secure a passage for debinding when the fly ash is burned during the sintering, thereby enhancing sintering characteristics of the ceramic laminated body 20.

Figure 4D:
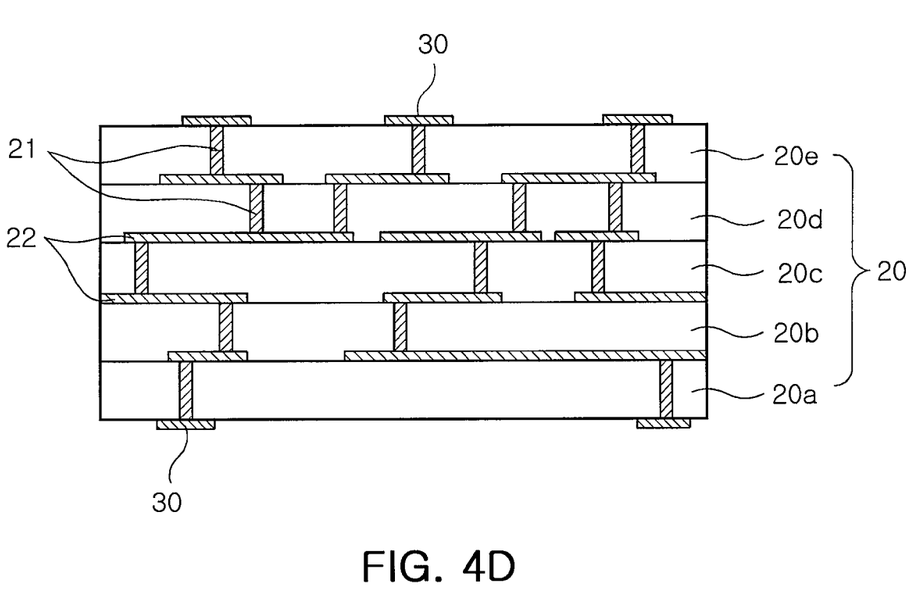

After sintering is completed, as shown in FIG. 4D, the constraining green sheets 10 are removed from the ceramic laminated body 20. Here, the constraining green sheets 10 remain un-sintered and thus can be removed in the form of a powder. Moreover, the ceramic laminated body shrinks only in a thickness direction but hardy shrinks in a plane direction.

Thereafter, conductor pasts are screen printed on the top and bottom surfaces of the ceramic laminated body 20 to form external electrodes 30, thereby producing the multilayer ceramic substrate.

Hereinafter, multilayer ceramic substrates were manufactured according to Inventive Examples of the present invention and Comparative Examples, respectively and characteristics thereof were measured.

[Fabricating a Non-Sintered Multilayer Ceramic Laminated Body]

An acrylic binder was added at 15 wt % and a dispersant was added at 0.5 wt % with respect to 100% of a glass-ceramic powder. Also, a mixed solvent of toluene and ethanol was added, and then dispersed using a ball mill to produce a slurry. The slurry obtained was filtered and deareated, and a ceramic green sheet having a thickness of 50 μm was formed using doctor blading. The ceramic green sheet was cut in a predetermined size and a predetermined electrode pattern was formed by screen printing. Afterwards, 20 layers of ceramic green sheets were pressed and laminated to fabricate a unified non-sintered multilayer ceramic laminated body.

[Fabricating a Constraining Green Sheet]

Table 1 below notes conditions of constraining green sheets according to Inventive Examples 1 and 2 and Comparative Examples 1 and 2. The constraining green sheets were fabricated as follows under the conditions of Inventive Examples 1 and 2 and Comparative Examples 1 and 2.

TABLE 1

|  | $1^{st}$ constraining layer (alumina powder) | 2nd constraining layer (alumina powder) | |
|---|---|---|---|
|  | Average particle size | Average particle size | Fly ash |
| Inventive Ex. 1 | 1.5 μm | 1.5 μm | Present |
| Inventive Ex. 2 | 4 μm | 4 μm | Present |
| Comparative Ex. 1 | 1.5 μm | 1.5 μm | Non-present |
| Comparative Ex. 2 | 4 μm | 4 μm | Non-present |

INVENTIVE EXAMPLE 1

The constraining green sheet was fabricated under the conditions of the present embodiment to include first and second constraining layers. An acrylic binder was added at 15 wt % and a dispersant was added at 0.5 wt %, with respect to an alumina powder having a density of 3.95 g/cm³ and an average particle size of 1.5 μm. Also, a mixed solvent of toluene and ethanol was added. Then, the mixture was dispersed using a ball mill to produce a first slurry.

Moreover, a fly ash of 20 wt %, an acrylic binder of 15 wt %, a dispersant of 15 wt %, and a mixed solvent of toluene and ethanol were added to an alumina powder having a density of 3.95 g/cm³ and an average particle size of 1.5 μm. The mixture was dispersed using a ball mill to produce a second slurry.

Thereafter, the first slurry was filtered and deareated, and applied using doctor blading. Also, before the first slurry was dried, the second slurry was applied using doctor blading. Through these processes, a constraining green sheet having a thickness of 200 μm was manufactured.

INVENTIVE EXAMPLE 2

An acrylic binder of 15 wt %, a dispersant of 0.5 wt %, and a mixed solvent of toluene and ethanol were added to an alumina powder having a density of 3.95 g/cm³ and an average particle size of 4 µm. The mixture was dispersed using a ball mill to produce a first slurry.

Also, a fly ash of 20 wt %, an acrylic binder of 15 wt %, a dispersant of 15 wt % and a mixed solvent of toluene and ethanol were added to an alumina powder having a density of 3.95 g/cm³ and an average particle size of 4 µm. The mixture was dispersed using a ball mill to produce a second slurry.

Thereafter, the first slurry was filtered and deareated, and applied using doctor blading. Also, before the first slurry was dried, the second slurry was applied using doctor blading. Through these processes, a constraining green sheet having a thickness of 200 µm was fabricated.

COMPARATIVE EXAMPLE 1

For comparison with the Inventive Examples 1 and 2, an alumna powder having a density of 3.95 g/cm³ and an average particle size of 1.5 µm was employed singly to fabricate a constraining green sheet having a thickness of 200 µm.

COMPARATIVE EXAMPLE 2

Moreover, to conduct comparative tests with Inventive Examples 1 and 2, an alumina powder having a density of 3.95 g/cm³ and an average particle size of 4 µm was employed alone to fabricate a constraining green sheet having a thickness of 200 µm.

In fabricating the constraining green sheets of Comparative Example 1 and Comparative Example 2, the organic binder, dispersant and mixed solvent identical to those of Inventive Examples 1 and 2 were added and subjected to identical fabrication processes.

[Bonding Between the Ceramic Laminated Body and the Constraining Green Sheet]

The constraining green sheet was cut to a thickness of 200 µm in an identical size to the non-sintered ceramic laminated body. Then, the cut constraining green sheets were attached on top and bottom surfaces of the non-sintered ceramic substrate and then thermally compressed under a pressure of 300 kgf/cm³ and at a temperature of 85° C. to manufacture a unified laminated body.

The two constraining green sheets fabricated under the conditions noted in Table 1 were employed. Particularly, Inventive Examples 1 and 2 utilized the constraining green sheets each containing a fly ash. Comparative Examples 1 and 2 utilized the constraining green sheets each containing the alumina powder alone without the fly ash.

[De-Binding and Sintering]

Temperature was increased at a rate of 60° C. per hour until 420° C. up to which an organic material is decomposed form a room temperature. To ensure sufficient de-binding time, the temperature was kept at 420° C. for two hours. After de-binding, the temperature was increased to 300° C. per hour until reaching a firing temperature of 870° C., and then maintained at 870° C. for 30 minutes to perform sintering. After the sintering, the laminated body was cooled down to a room temperature to obtain a sintered body.

The constraining green sheet was removed from the sintered body obtained, and a residual carbon content and shrinkage ratio of the ceramic laminated body were measured. Table 2 below notes firing results of the multilayer ceramic substrate fabricated using the constraining green sheets according to Inventive Examples 1 and 2 and Comparative Examples 1 and 2.

TABLE 2

| | Multilayer ceramic substrate | |
|---|---|---|
| | Residual carbon content [ppm] | Shrinkage ratio [%] |
| Inventive Ex. 1 | 53 | 0.26 |
| Inventive Ex. 2 | 50 | 0.46 |
| Comparative Ex. 1 | 122 | 0.24 |
| Comparative Ex. 2 | 75 | 0.41 |

As shown in Comparative Example 1 of Table 2, the constraining green sheet containing the alumina powder having a relatively small average particle size, when employed, ensures a larger contact point with the ceramic laminated body and less shrinkage. However, the small average particle size of the alumina powder hinders easy debinding, thus leading to a high residual carbon content of the multilayer ceramic substrate.

Moreover, referring to Comparative Example 2 of Table 2, the constraining green sheet containing the alumina powder having a relatively big average particle size, when employed, ensures easy de-binding, thus leading to a low residual carbon content. However, the alumina powder having a relatively great average particle size results in a smaller contact point with the ceramic laminated body and accordingly more shrinkage.

Meanwhile, as shown in Inventive Example 2 of Table 2, the constraining green sheet contains an alumina powder having a relatively great average particle size and a fly ash burned at a low temperature than a sintering temperature of the ceramic laminated body. The Inventive Example 2 exhibits a low residual carbon content since voids among the alumina powder particles and voids created by burning of the fly ash during sintering serve as a passage for debinding, thereby facilitating debinding. When compared with Comparative Example 2, even though the alumina powder having an identical average particle size, i.e., 4 µm is employed, the Inventive Example 2 containing the fly ash shows a relatively smaller residual carbon content than Inventive Example 2.

Referring to Inventive Example 1 of the present invention, the constraining green sheet contains the alumina powder having a relatively small average particle size and a fly ash burned at a temperature lower than a sintering temperature of the ceramic laminated body. The Inventive Example 1 demonstrates better results in terms of the residual carbon content and shrinkage. Specifically, the alumina powder having a small average particle size ensures a larger contact point with the ceramic laminated body, thus leading to low shrinkage. Moreover, the Inventive Example 1 secures a passage for debinding through burning of the fly ash, thus leading to a low residual carbon content.

Consequently, as aimed in the present invention, to inhibit shrinkage of the ceramic laminated body and ensure a passage for debinding, the inorganic powder having a relatively small average particle size contains the fly ash according to the Inventive Example 1 to attain the most improved result.

As set forth above, according to exemplary embodiments of the invention, a constraining green sheet contains an inorganic powder and a fly ash to effectively suppress a ceramic laminated body from shrinking in an x-y direction of the ceramic laminated body. Also, when the ceramic laminated body is sintered, the fly ash is burned to form voids in the constraining green sheet to serve as a passage for debinding.

Accordingly, this enhances sintering characteristics of the ceramic laminated body and thus product reliability of a multilayer ceramic substrate.

While the present invention has been shown and described in connection with the exemplary embodiments, it will be apparent to those skilled in the art that modifications and variations can be made without departing from the spirit and scope of the invention as defined by the appended claims.

What is claimed is:

1. A constraining green sheet to be disposed on one of top and bottom surfaces of a non-sintered ceramic laminated body, the constraining green sheet comprising:
    a first constraining layer having a surface disposed on the one of the top and bottom surfaces of the ceramic laminated body, the first constraining layer containing a first inorganic powder; and
    a second constraining layer disposed on a top of the first constraining layer and containing a second inorganic powder and a fly ash,
    wherein the fly ash is capable of being burned to ensure a passage for debinding during sintering of the ceramic laminated body, burning temperature of the fly ash being lower than a sintering temperature of the ceramic laminated body.

2. The constraining green sheet of claim 1, wherein the first inorganic powder has a particle size of 1.0 to 2.5 µm.

3. The constraining green sheet of claim 1, wherein the fly ash comprises at least one material selected from a group consisting of carbon, black lead, activated carbon, wood powder, sawdust, and talc.

4. The constraining green sheet of claim 1, wherein the first inorganic powder has a composition different from that of the second inorganic powder.

* * * * *